(12) United States Patent
Hopkins et al.

(10) Patent No.: US 9,608,000 B2
(45) Date of Patent: Mar. 28, 2017

(54) DEVICES AND METHODS INCLUDING AN ETCH STOP PROTECTION MATERIAL

(71) Applicant: Micron Technology, Inc., Boise, ID (US)

(72) Inventors: John Hopkins, Meridian, ID (US); Darwin Franseda Fan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/722,824

(22) Filed: May 27, 2015

(65) Prior Publication Data

US 2016/0351580 A1    Dec. 1, 2016

(51) Int. Cl.
| | | |
|---|---|---|
| H01L 29/788 | (2006.01) |
| H01L 27/11556 | (2017.01) |
| H01L 21/28 | (2006.01) |
| H01L 21/02 | (2006.01) |
| H01L 21/311 | (2006.01) |
| H01L 29/49 | (2006.01) |

(52) U.S. Cl.
CPC .. *H01L 27/11556* (2013.01); *H01L 21/02238* (2013.01); *H01L 21/28273* (2013.01); *H01L 21/31111* (2013.01); *H01L 29/4916* (2013.01); *H01L 29/7883* (2013.01)

(58) Field of Classification Search
CPC ......... H01L 27/11556; H01L 21/02238; H01L 21/28273; H01L 21/31111; H01L 29/4916; H01L 29/7883
USPC ................................................ 257/314–326
See application file for complete search history.

(56) References Cited

U.S. PATENT DOCUMENTS

| | | |
|---|---|---|
| 6,159,797 A | 12/2000 | Lee |
| 6,445,029 B1 | 9/2002 | Lam et al. |
| 6,583,009 B1 | 6/2003 | Hui et al. |
| 7,369,436 B2 | 5/2008 | Forbes |
| 7,682,902 B2 | 3/2010 | Hsiao et al. |
| 7,910,446 B2 | 3/2011 | Ma et al. |
| 8,124,478 B2 | 2/2012 | Park et al. |
| 8,187,936 B2 | 5/2012 | Alsmeier et al. |

(Continued)

FOREIGN PATENT DOCUMENTS

| | | |
|---|---|---|
| CN | 105027285 A | 11/2015 |
| JP | 2012146773 A | 8/2012 |

(Continued)

OTHER PUBLICATIONS

"U.S. Appl. No. 13/748,747, Examiner Interview Summary mailed Jul. 9, 2014", 3 pgs.

(Continued)

*Primary Examiner* — Ori Nadav
(74) *Attorney, Agent, or Firm* — Schwegman Lundberg & Woessner, P.A.

(57) ABSTRACT

Protective dielectrics are discussed generally herein. In one or more embodiments, a three-dimensional vertical memory may include a protective dielectric material. A device may include an etch stop material, a first control gate (CG) over the etch stop material, a first CG recess adjacent the first CG, a trench adjacent the first CG recess, and an at least partially oxidized polysilicon on at least a portion of the etch stop material. The at least partially oxidized polysilicon may line a sidewall of the trench and may line the first CG recess.

6 Claims, 19 Drawing Sheets

(56) References Cited

U.S. PATENT DOCUMENTS

| | | | |
|---|---|---|---|
| 8,258,034 B2 | 9/2012 | Ramaswamy et al. | |
| 8,581,321 B2* | 11/2013 | Son | H01L 27/11582 257/314 |
| 8,680,605 B2 | 3/2014 | Jeon et al. | |
| 8,946,807 B2 | 2/2015 | Hopkins et al. | |
| 9,171,863 B2* | 10/2015 | Wang | H01L 29/7889 |
| 9,230,986 B2 | 1/2016 | Hopkins et al. | |
| 9,231,086 B2* | 1/2016 | Khoueir | H01L 29/7889 |
| 2005/0133851 A1 | 6/2005 | Forbes | |
| 2006/0237768 A1 | 10/2006 | Forbes et al. | |
| 2008/0067583 A1* | 3/2008 | Kidoh | H01L 21/8221 257/326 |
| 2008/0173928 A1* | 7/2008 | Arai | H01L 29/7926 257/316 |
| 2008/0253183 A1 | 10/2008 | Mizukami et al. | |
| 2008/0277720 A1 | 11/2008 | Youn et al. | |
| 2009/0026460 A1 | 1/2009 | Ou et al. | |
| 2009/0121271 A1 | 5/2009 | Son et al. | |
| 2009/0184360 A1* | 7/2009 | Jin | H01L 21/28273 257/319 |
| 2009/0283819 A1* | 11/2009 | Ishikawa | H01L 21/28282 257/324 |
| 2010/0003795 A1 | 1/2010 | Park et al. | |
| 2010/0163968 A1 | 7/2010 | Kim et al. | |
| 2010/0181612 A1 | 7/2010 | Kito et al. | |
| 2010/0200908 A1 | 8/2010 | Lee et al. | |
| 2010/0240205 A1 | 9/2010 | Son et al. | |
| 2010/0323505 A1* | 12/2010 | Ishikawa | H01L 21/0273 438/492 |
| 2011/0201167 A1* | 8/2011 | Satonaka | H01L 27/11578 438/268 |
| 2011/0220987 A1 | 9/2011 | Tanaka et al. | |
| 2011/0248334 A1 | 10/2011 | Sandhu et al. | |
| 2011/0294290 A1 | 12/2011 | Nakanishi | |
| 2012/0001247 A1 | 1/2012 | Alsmeier | |
| 2012/0001249 A1 | 1/2012 | Alsmeier et al. | |
| 2012/0058629 A1 | 3/2012 | You et al. | |
| 2012/0132981 A1 | 5/2012 | Imamura et al. | |
| 2012/0217564 A1 | 8/2012 | Tang et al. | |
| 2012/0326221 A1 | 12/2012 | Sinha | |
| 2013/0171788 A1 | 7/2013 | Yang et al. | |
| 2014/0203344 A1 | 7/2014 | Hopkins et al. | |
| 2014/0264532 A1 | 9/2014 | Dennison et al. | |
| 2015/0140797 A1 | 5/2015 | Hopkins et al. | |
| 2016/0093626 A1* | 3/2016 | Izumi | H01L 21/7688 257/324 |
| 2016/0133752 A1 | 5/2016 | Hopkins et al. | |

FOREIGN PATENT DOCUMENTS

| | | |
|---|---|---|
| KR | 1020120101818 A | 9/2012 |
| TW | 201442211 A | 11/2014 |
| TW | 201526207 A | 7/2015 |
| WO | WO-2012009140 A2 | 1/2012 |
| WO | WO-2014116864 A1 | 7/2014 |
| WO | WO-2014149740 A1 | 9/2014 |

OTHER PUBLICATIONS

"U.S. Appl. No. 13/748,747, Non Final Office Action mailed Apr. 29, 2014", 15 pgs.

"U.S. Appl. No. 13/748,747, Notice of Allowance mailed Sep. 24, 2014", 8 pgs.

"U.S. Appl. No. 13/748,747, Response filed Mar. 13, 2014 to Restriction Requirement mailed Feb. 21, 2014", 9 pgs.

"U.S. Appl. No. 13/748,747, Response filed Jul. 29, 2014 to Non Final Office Action mailed Apr. 29, 2014", 13 pgs.

"U.S. Appl. No. 13/748,747, Restriction Requirement mailed Feb. 21, 2014", 6 pgs.

"U.S. Appl. No. 13/838,297, Final Office Action mailed Aug. 21, 2014", 9 pgs.

"U.S. Appl. No. 13/838,297, Non Final Office Action mailed Apr. 24, 2014", 8 pgs.

"U.S. Appl. No. 13/838,297, Response filed Apr. 14, 2014 to Restriction Requirement mailed Jan. 12, 2014", 7 pgs.

"U.S. Appl. No. 13/838,297, Response filed Jul. 24, 2014 to Non Final Office Action mailed Apr. 24, 2014", 9 pgs.

"U.S. Appl. No. 13/838,297, Response filed Oct. 21, 2014 to Final Office Action mailed Aug. 21, 2014", 10 pgs.

"U.S. Appl. No. 13/838,297, Restriction Requirement mailed Feb. 12, 2014", 6 pgs.

"U.S. Appl. No. 14/610,755, Notice of Allowance mailed Sep. 1, 2015", 8 pgs.

"U.S. Appl. No. 14/987,147, Non Final Office Action mailed Aug. 9, 2016", 6 pgs.

"U.S. Appl. No. 14/987,147, Preliminary Amendment filed Jan. 19, 2016", 7 pgs.

"Chinese Application Serial No. 201480013075.1, Preliminary Amendment filed May 30, 2016", W/ English Claims, 48 pgs.

"European Application Serial No. 14743125.8, Extended European Search Report mailed Jun. 21, 2016", 8 pgs.

"European Application Serial No. 14743125.8, Preliminary Amendment filed Mar. 9, 2016", 13 pgs.

"International Application Serial No. PCT/US2014/012798, International Preliminary Report on Patentability mailed Aug. 6, 2015", 13 pgs.

"International Application Serial No. PCT/US2014/012798, International Search Report mailed May 19, 2014", 3 pgs.

"International Application Serial No. PCT/US2014/012798, Written Opinion mailed May 19, 2014", 11 pgs.

"International Application Serial No. PCT/US2014/020658, International Search Report mailed Jun. 26, 2014", 3 pgs.

"International Application Serial No. PCT/US2014/020658, Written Opinion mailed Jun. 26, 2014", 4 pgs.

"Taiwanese Application Serial No. 103102815, Amendment filed Nov. 10, 2014", W/ English Claims, 52 pgs.

"Taiwanese Application Serial No. 104110136, Office Action mailed Jan. 26, 2016", W/ English Translation, 3 pgs.

"Taiwanese Application Serial No. 104110136, Response filed Apr. 28, 2016 to Office Action mailed Jan. 26, 2016", W/ English Claims, 7 pgs.

Hang-Ting, Lue, et al., "A Novel Planar Floating-Gate (FG) / Charge Trapping (CT) NAND Device Using BE-SONOS Inter-Poly Dielectric (IPD)", In proceeding of: Electron Devices Meeting (IEDM), (2009), 34.3:1-4.

Kitamura, Takuya, et al., "A Low Voltage Operating Flash Memory Cell with High Coupling Ratio", (1998).

Kuppurao, Satheesh, et al., "EQuipment Frontiers: Thermal Processing: In situ steam generation: A new rapid thermal oxidation technique", Solid State Technology, (Jul. 2000), Cover, Index, 233-239.

* cited by examiner

DEVICES AND METHODS INCLUDING AN ETCH STOP PROTECTION MATERIAL

BACKGROUND

Some memory cells may include a dielectric between a control gate (CG) and a nitride structure. The dielectric may include an oxide. A floating gate (FG) may be separated from the nitride structure by another dielectric. The nitride structure may be wrapped around three sides of the FG. Charges may become undesirably trapped in the nitride structure, particularly in portions of the nitride structure that are not directly between the CG and the FG. The threshold voltage ($V_t$) of a cell may be altered by the trapped charges in the nitride structure. In a dielectric (e.g., nitride material or other dielectric) removal process, an etch stop material of a memory may be negatively affected.

DESCRIPTION OF THE EMBODIMENTS

Figure 1A:
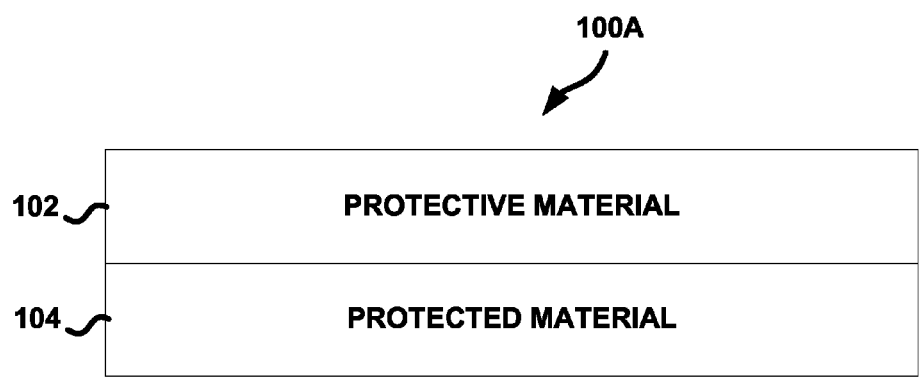
FIG. 1A illustrates, by way of example, a block diagram of an embodiment of a first material situated to protect a second material.

The following detailed description refers to the accompanying drawings which show, by way of illustration, specific aspects and embodiments in which the present subject matter may be practiced. These embodiments are described in sufficient detail to enable those skilled in the art to practice the present subject matter.

The term "horizontal" as used in this application is defined as a plane parallel to the conventional plane or surface of a wafer, such as a substrate, regardless of the actual orientation of the wafer or substrate. The term "vertical" refers to a direction perpendicular to the horizontal as defined above. Prepositions, such as "on", "side", "higher", "lower", "over" and "under" are defined with respect to the conventional plane or surface being on the top surface of the wafer or substrate, regardless of the actual orientation of the wafer or substrate. The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the present invention is defined only by the appended claims, along with the full scope of equivalents to which such claims are entitled.

A dielectric may be formed by a deposition (e.g., a conformal deposition) of a polysilicon (e.g., a thin film) and a subsequent oxidation that at least partially converts the polysilicon structure into an oxide (i.e. an oxidized polysilicon). The oxidized polysilicon structure may be formed on another material (e.g., a metal oxide, such as aluminum oxide, zirconium oxide, hafnium oxide, silver oxide, iron oxide, chromium oxide, titanium oxide, copper oxide, zinc oxide, or the like). An In Situ Steam Generation (ISSG) oxidation process may selectively oxidize exposed polysilicon. The oxidized polysilicon may be used as an etch barrier for a material covered by the oxidized polysilicon (e.g., a metal oxide). Such an oxidized polysilicon may protect a material that is susceptible to chemical interaction or damage from a downstream process. For example, the oxidized polysilicon may protect a metal oxide etch stop material from a hot phosphoric acid or other chemical, mechanical, or electrical removal process that is used to remove a material (e.g., a nitride material) situated on the oxidized polysilicon.

For a NAND memory, one or more embodiments of the disclosure may help reduce a problem associated with a chemical selectivity between a nitride material and an etch stop material (e.g., a metal oxide). One or more embodiments may provide a method of removing a nitride material from a sidewall of a trench without damaging an etch stop material. The nitride material may otherwise be a source of trapped charge in the channel or control gate recesses and may contribute to a reduced charge density (CD).

Generally, the devices and techniques are applicable to a situation in which a selective etch process may damage a first material, but does not interact with or damage a second material. In such a situation, the second material may be situated on the first material, the selective etch process may be performed, and the second material may help protect the first material from interacting with or being damaged by the selective etch process. The second material may be oxidized prior to performing the second etch process.

One category of devices that may benefit from such a protective material includes a vertical three-dimensional (3D) memory, such as that shown in FIGS. 3A-3K and FIGS. 4A-4E. In one or more embodiments, a 3D memory may include a memory stack. A memory stack may include a stack of at least two memory cells and a tier dielectric between adjacent memory cells, where each memory cell includes a control gate (CG) and a charge storage structure, such as a floating gate (FG) or charge trap (CT), configured to store electrons or holes accumulated thereon. Information is represented by the amount of electrons or holes stored by the cell. The memory stack may further include an inter-gate dielectric (IGD) comprising a composite of oxide-nitride-oxide ("ONO"), where the IGD may be between the charge storage structure and the CG. The nitride material and the charge storage structure may be laterally positioned adjacent, and/or horizontally aligned to each other, or have substantially equal heights. One or more of the oxides in the IGD may be an oxidized polysilicon, in one or more embodiments. The IGD may sometimes be referred to as an inter-poly dielectric (IPD), such as in an embodiment where the CG and the FG each include a polysilicon material.

A NAND array architecture is an array of memory cells arranged such that the memory cells of the array are coupled in logical rows to access lines (which are coupled to, and in some cases are at least partially formed by, the CGs of the memory cells), which are conventionally referred to as word lines. Some memory cells of the array are coupled together in series between a source and the data line, which is conventionally referred to as a bit line.

Memory cells in NAND array architecture may be programmed to a desired data state. For example, electric charge may be accumulated (e.g., placed) on, or removed from, an FG of a memory cell to program the cell into a desired one of a number of data states. A memory cell conventionally referred to as a single level cell (SLC) may be programmed to a desired one of two data states, e.g., a "1"

or a "0" state. Memory cells conventionally referred to as multilevel cells (MLCs) may be programmed to a desired one of more than two data states.

The $V_t$ of the cell may be modified by storing electrons on the FG. Thus, when the cell is "read" by placing a specific voltage on the CG (e.g., by driving the access line coupled to the cell with a read voltage), electrical current will either flow or not flow in the cell's channel depending on the $V_t$ of the cell and the specific voltage placed on the CG. This presence or absence of current may be sensed and translated into 1's and 0's, reproducing the stored data.

Each memory cell may not directly couple to a source and a data line. Instead, the memory cells of an example array may be arranged together in strings, typically of 4, 8, 16, 32, or more cells each, where the memory cells in the string are coupled together in series between a common source and a data line.

A NAND array may be accessed by a row decoder activating a row of memory cells by driving the access line coupled to those cells with a voltage. In addition, the access lines coupled to the unselected memory cells of each string may be driven with a different voltage. For example, the unselected memory cells of each string may be driven with a pass voltage so as to operate them as pass transistors, allowing them to pass current in a manner that is unrestricted by their programmed data states. Current may then flow from the source to the data line through each memory cell of the series coupled string, restricted by the memory cell of each string that is selected to be read. This places the currently encoded, stored data values of the row of selected memory cells on the data lines. A page of data lines is selected and sensed, and then individual data words may be selected from the sensed data words from the page and communicated from the memory apparatus.

The flash memory, such as a NAND array, may be formed as a 3D memory with stacks of more than one memory cells. The CGs for the memory cells may be adjacent to CG recesses.

FIG. 1A shows a block diagram an example of a portion of a device 100A, in accord with one or more embodiments. The device 100A may include a protective material 102 and a protected material 104. The protected material 104 may be protected from a chemical process, mechanical process, electrical process, or a combination thereof, by the protective material 102. The protective material 102 may include an electrical, mechanical, or chemical property that makes it resistant to or immune from a process that may harm or alter the protected material 104.

Figure 1B:
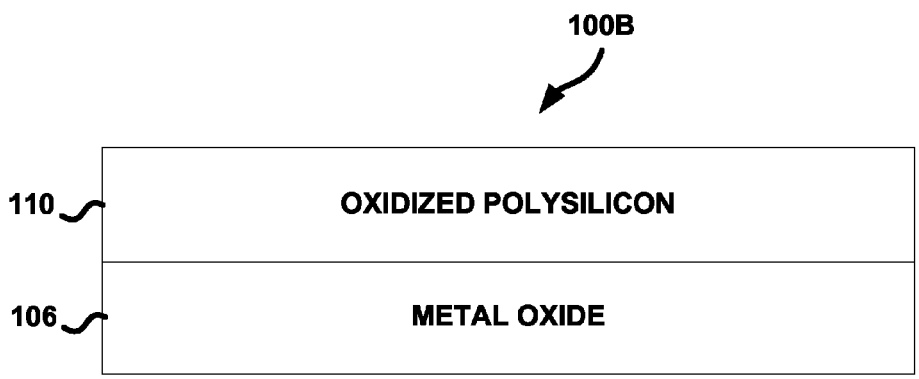
FIG. 1B illustrates, by way of example, a block diagram of another embodiment of a first material situated to protect a second material.

FIG. 1B shows a block diagram of an example of a portion of a device 100B, in accord with one or more embodiments. The portion of the device 100B may include an oxidized polysilicon 110 on a metal oxide 106. The oxidized polysilicon 110 may include a polysilicon that is at least partially converted to an oxide, such as by performing an ISSG process on the polysilicon. The polysilicon may be deposited (e.g., using a conformal deposition process) on the metal oxide 106 prior to performing the ISSG process. The oxidized polysilicon 110 may protect the metal oxide from a hot phosphorous etch process or other selective chemical process that may damage or otherwise alter the metal oxide 106.

Figure 2A:
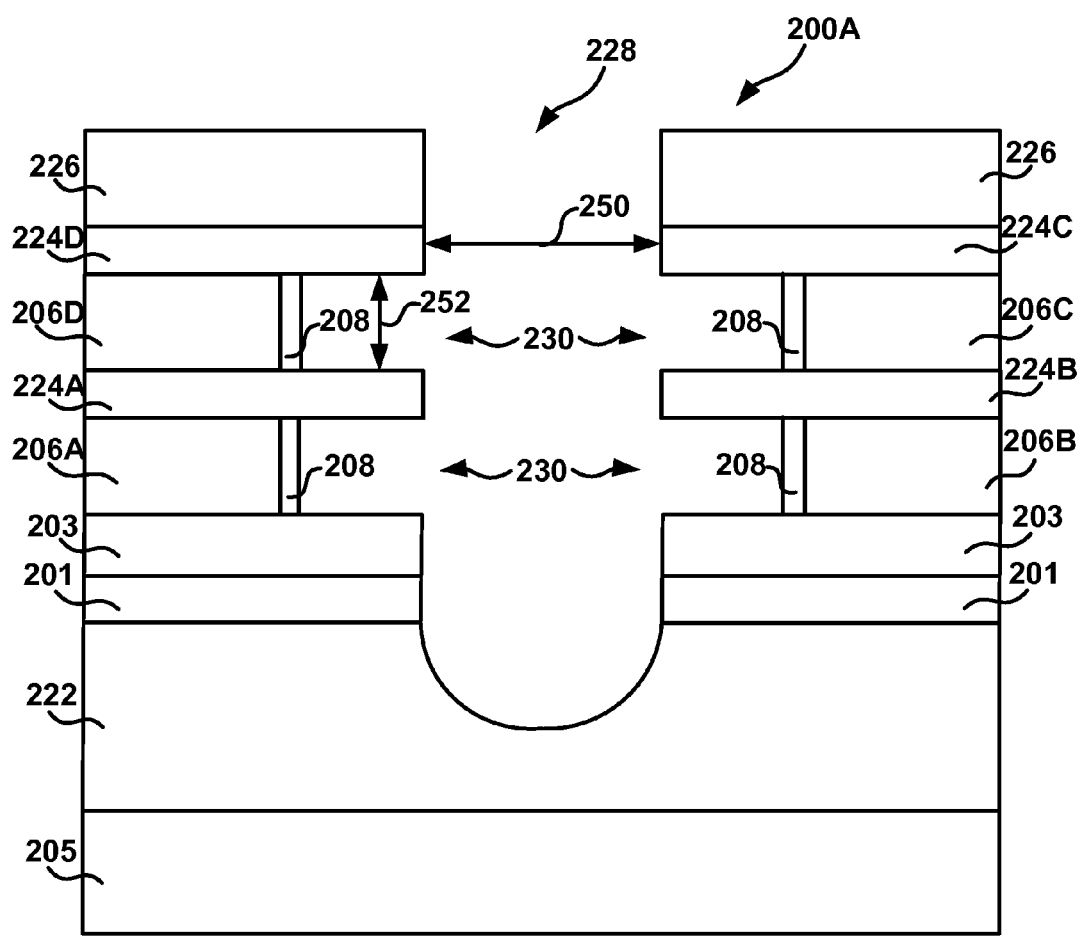
FIGS. 2A and 2B illustrate cross-section views of examples of a vertical three-dimensional memory.

FIG. 2A shows a cross-section view of an example of a vertical three-dimensional memory 200A. FIG. 2A shows a first CG 206A, 206B over an etch stop material 222, a first tier dielectric 224A, 224B over the first CG 206A-B, a second CG 206C, 206D over the first tier dielectric 224A-B, a second tier dielectric 224C, 224D over the second CG 206C-D, and a mask material (e.g., dielectric, such as oxide, nitride, or polysilicon) 226 over the second tier dielectric 224C-D. The memory 200A may include an oxide 208 situated in a control gate recess 230. The oxide 208 may be grown on the CG using an ISSG process. A CG recess 230 may include a height dimension 252. A trench 228 may include a width dimension 250.

Figure 2B:
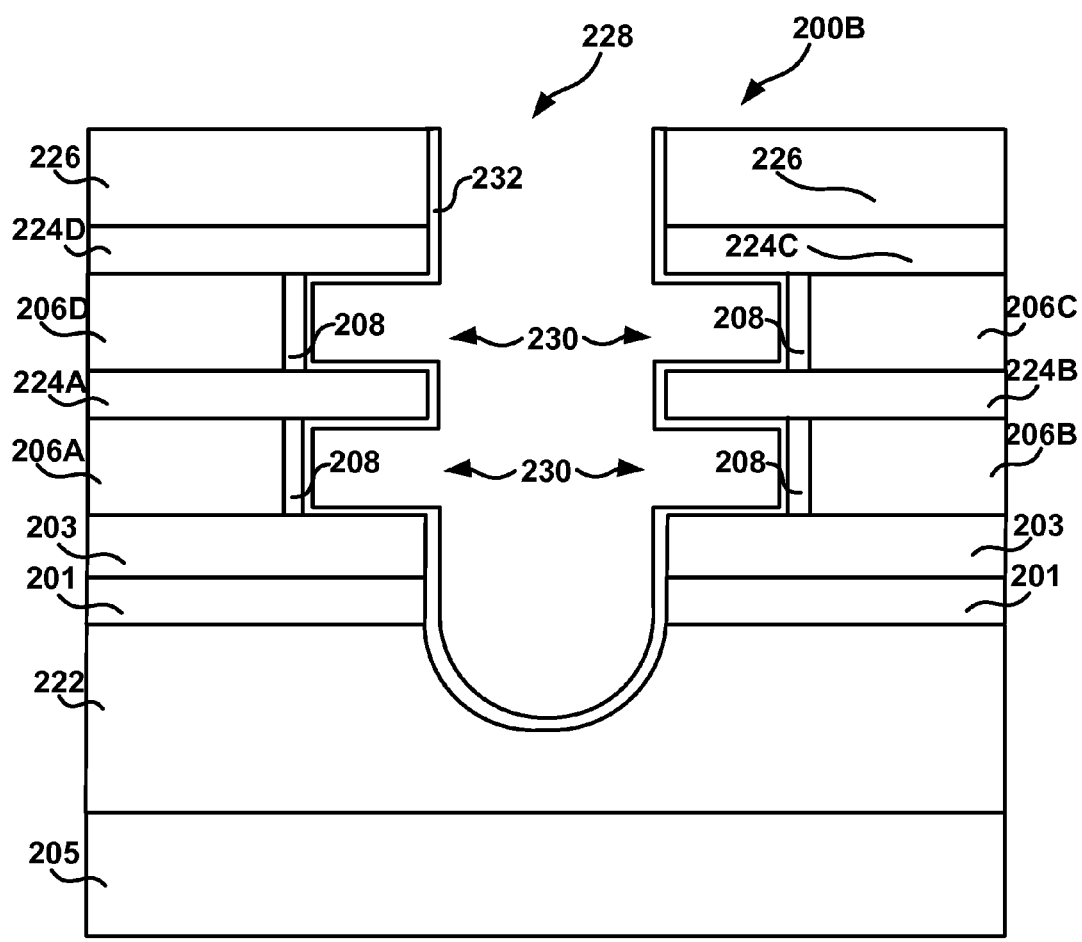

FIG. 2B shows a cross-section view of an example of a vertical three-dimensional memory 200B. The memory 200B may be similar to the memory 200A with the memory 200B including a nitride material 232 on sidewalls of the trench 228 and in the CG recesses 230. A process to remove the nitride material 232 from the trench 228 and leave the nitride material 232 only in the CG recesses 230 may damage an etch stop material 222, thus making it difficult to remove the nitride material 232 from the trench 228. The process of removing the nitride material 232 may also damage other items of FIGS. 2A and 2B, such as the mask material 226, or the tier dielectric 224A-D.

FIG. 3A-K shows a cross-section view of process steps of an example of a technique of making a device 300, such as a vertical NAND memory. The technique as shown in FIGS. 3A-3K includes a protective material (e.g., an at least partially oxidized polysilicon 310 as shown in the process of FIGS. 3C-3K) protecting a material (e.g., an etch stop material 322, such as a metal oxide, as shown in FIGS. 3A-3k) from a downstream process (e.g., a hot phosphoric acid removal process or another process mentioned with regard to FIGS. 3D-3K). Note that the notation "300" is used herein to refer generally to the result of a process that may include intermediate devices 300A, 300B, 300C, 300D, 300E, 300F, 300G, 300H, 300I, 300J, and/or 300K.

Figure 3A:
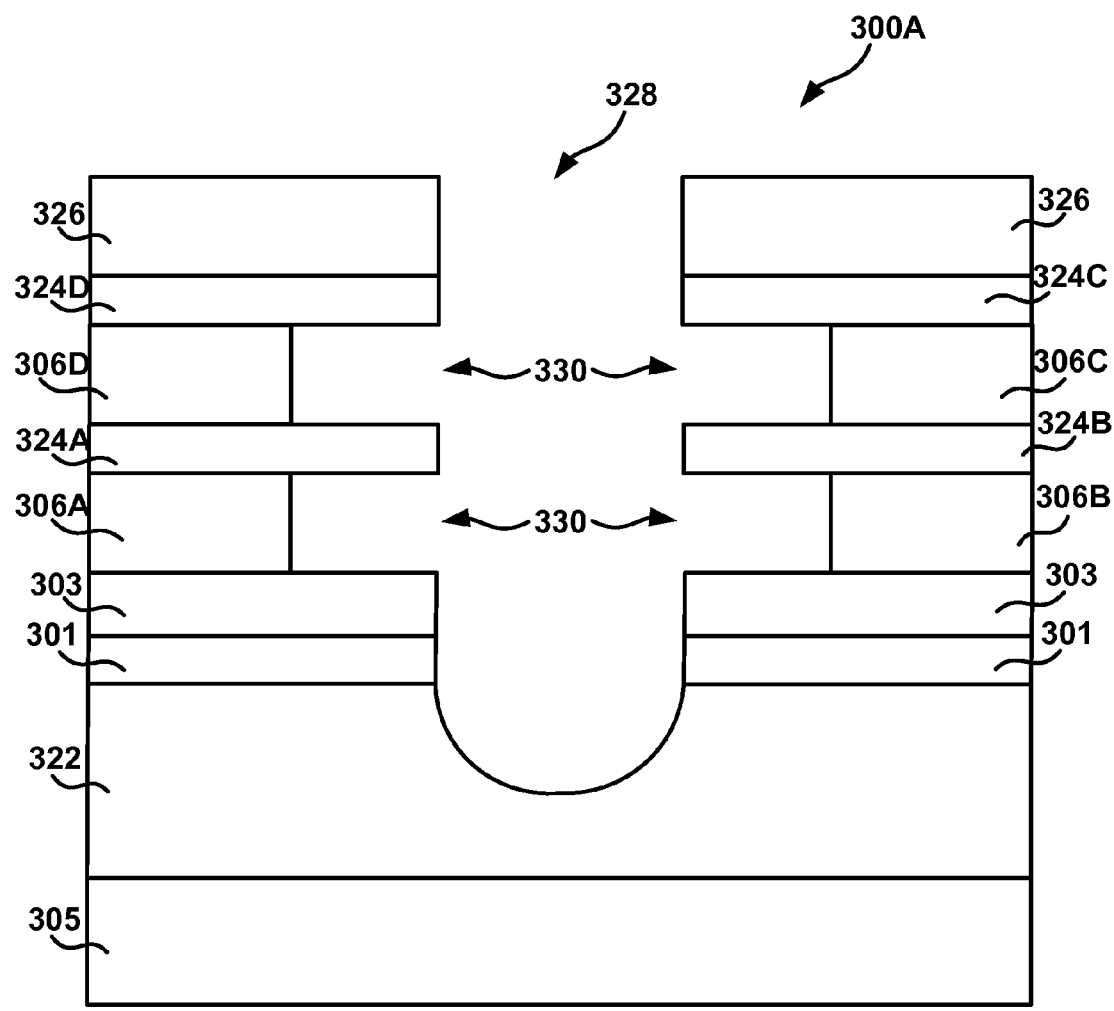
FIGS. 3A-3K illustrate, by way of example, block diagrams of an embodiment of a technique of making a vertical memory.

FIG. 3A shows a device 300A including an etch stop material 322 over a source 305, a polysilicon material 301 over the etch stop material 322, and a first tier dielectric 303 over the polysilicon material 301. The device 300A as illustrated includes a first CG 306A, 306B over the tier dielectric 303, a second tier dielectric 324A, 324B over the first CG 306A-B, a second CG 306C, 306D over the tier dielectric 324A-B, a third tier dielectric 324C, 324D over the second CG 306C-D, and a mask material (e.g., dielectric, such as oxide, nitride, or polysilicon) 326 over the second tier dielectric 324C-D. The device 300A may include a trench 328 and a plurality of CG recesses 330. The polysilicon material 301 can operate as a select gate source (SGS) for the device.

Figure 3B:
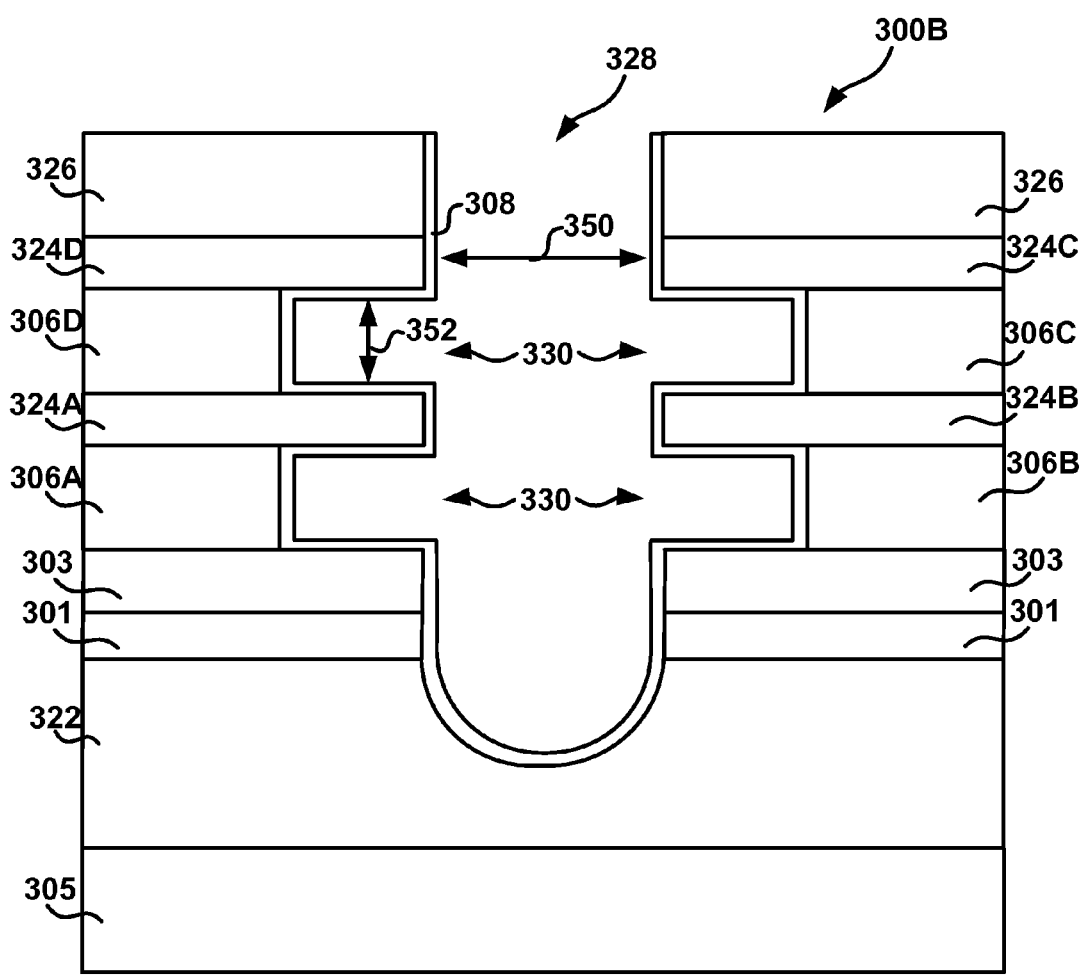

A polysilicon 308, may be formed on the sidewalls of the trench 328 and on exposed surfaces of the CGs 306A-D in the CG recesses 330, such as shown in the device 300B of FIG. 3B. The CG recesses 330 may be gaps (filled or unfilled) between tier dielectrics 324 adjacent to the CGs 306A-D formed between the tier dielectrics 324A-D.

The polysilicon 308 may reduce one or more dimensions of the device 300B as compared to the device 200A. For example, the CG recesses 330 may include a height dimension 352 that is smaller than the height dimension 252 of the CG recesses 230. The width dimension 350 of the trench 328 may be smaller than the width dimension 250 of the trench 228.

Figure 3C:
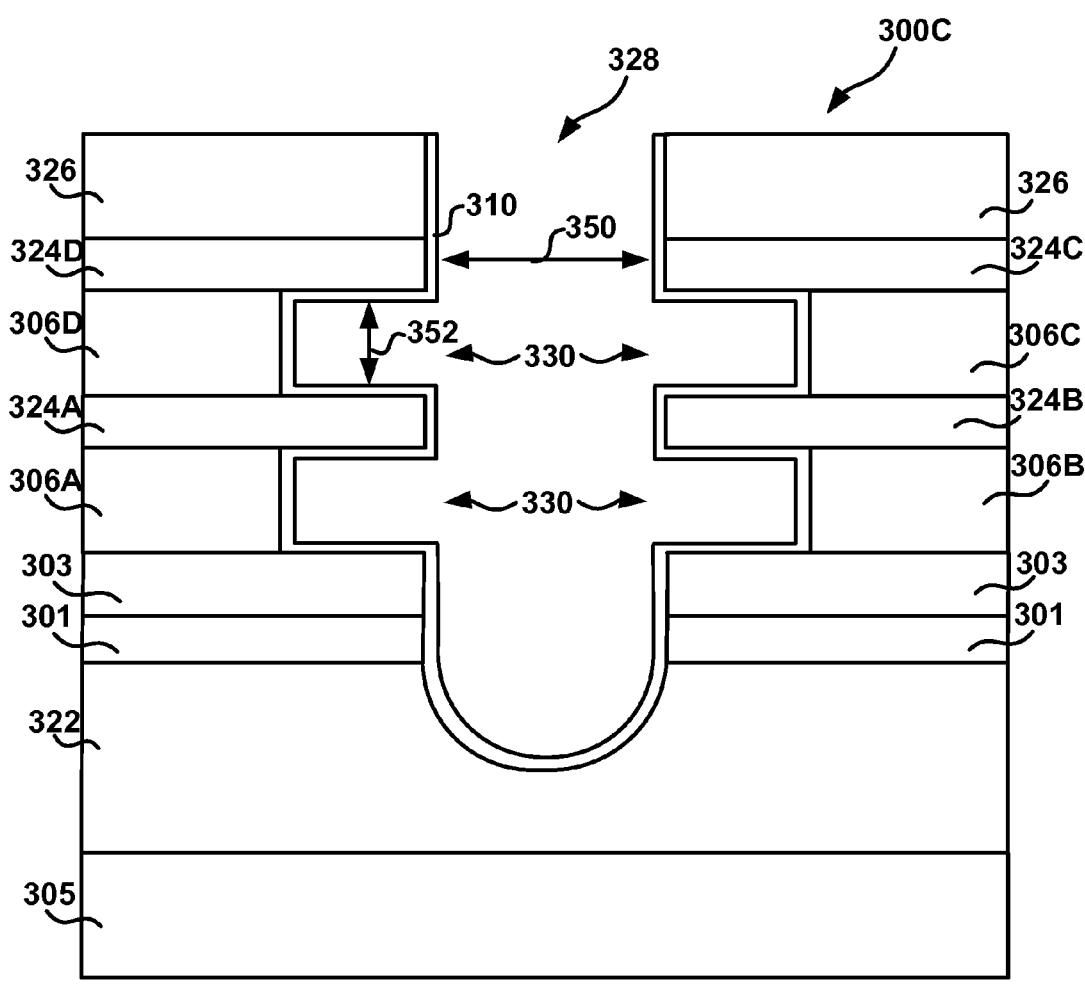

The polysilicon 308 may be at least partially oxidized and converted to an oxidized polysilicon 310, such as shown in device 300C of FIG. 3C. The polysilicon 308 may be converted to the oxidized polysilicon 310 by using an ISSG process. The ISSG process is a selective process that oxidizes exposed polysilicon, such as the polysilicon 308, but does not oxidize the CG 306A-D, the etch stop material 322, the tier dielectric 303, 324A-D, and/or the mask material 326. The oxidized polysilicon 310 may help protect the etch stop material 322 from a downstream process, such as a dielectric material removal process that may chemically interact with the etch stop material 322 and change or damage the etch stop material 322.

Figure 3D:
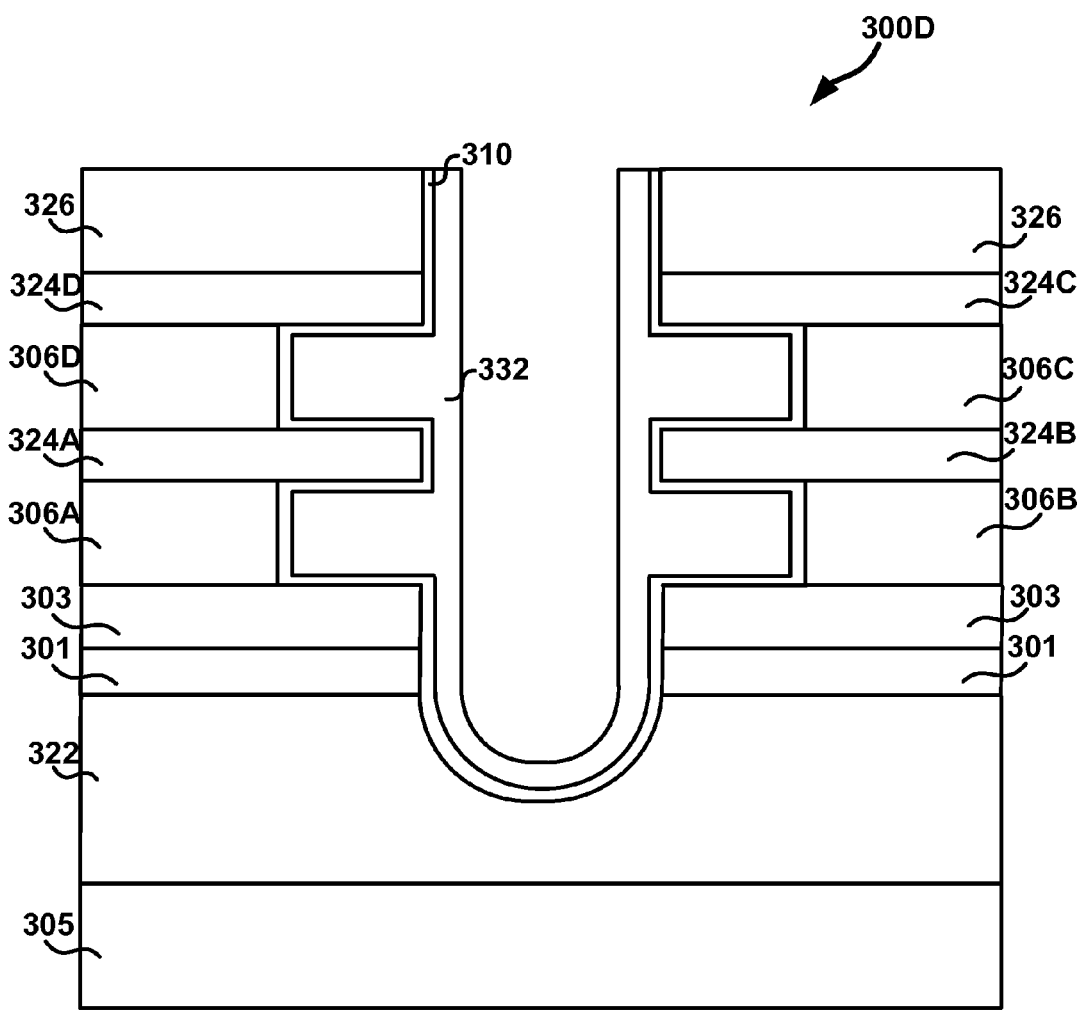
Figure 3E:
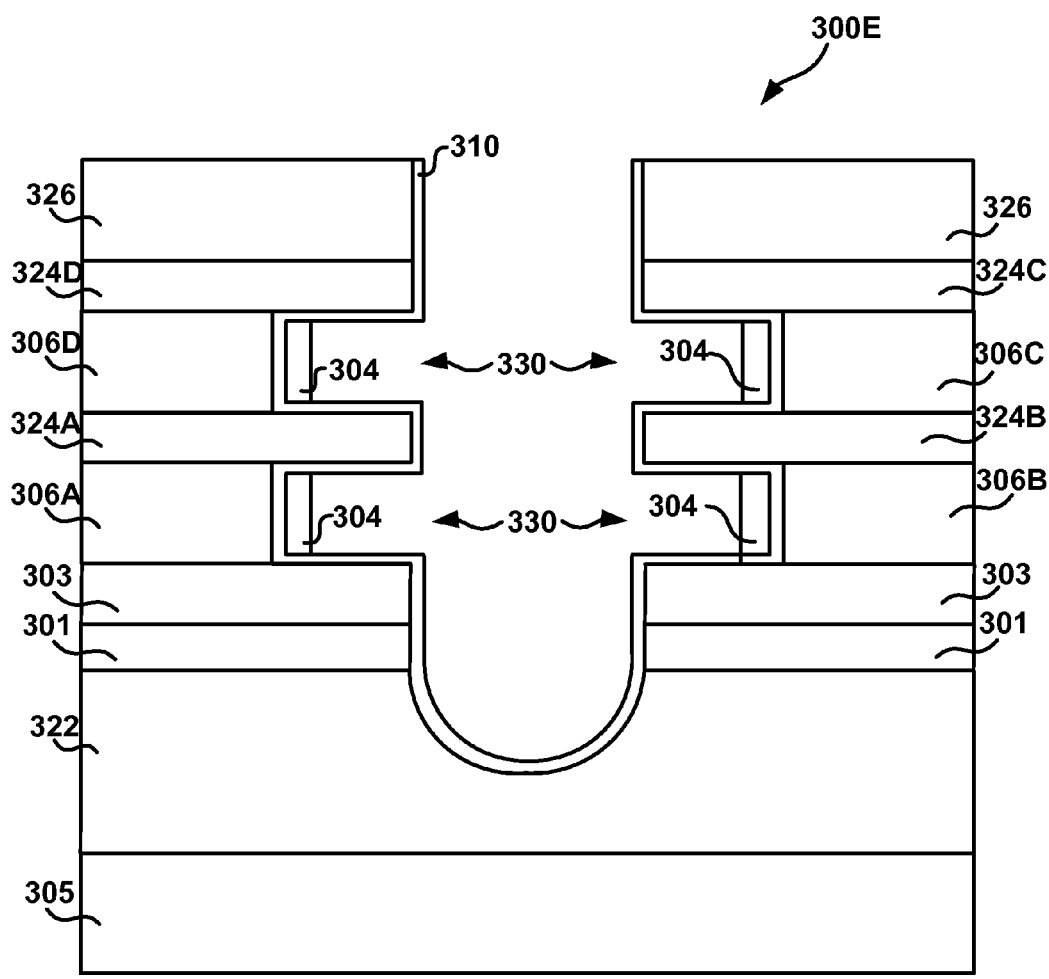

The trench 328 and the CG recesses 330 may be at least partially filled with a nitride material 332, such as shown in the device 300D of FIG. 3D. The nitride material 332 may be deposited or otherwise formed in the trench 328 and CG recesses 330. The nitride material 332 may be partially removed, such as by using a mechanical, chemical, laser, vapor, or photo etching process. The nitride material 332 may be partially removed from the trench 328 and CG recesses 330 to leave at least some of the nitride material 332 in the CG recesses 330 to form a nitride structure 304 adjacent to the CGs 306, such as shown in the device 300E of FIG. 3E. Each nitride structure 304 in a respective CG 330 may be electrically isolated from the other nitride structures 304. The nitride material 332 may be removed using hot phosphoric acid. The size or shape of the nitride material 332 remaining after the process may be controlled by using hot phosphoric acid at different temperatures or concentrations, or by exposing the nitride material 332 to the hot phosphoric acid for varying amounts of time. The oxidized polysilicon 310 may help protect the etch stop material 322 from the hot phosphoric acid or other process used to remove nitride material 332.

Figure 3F:
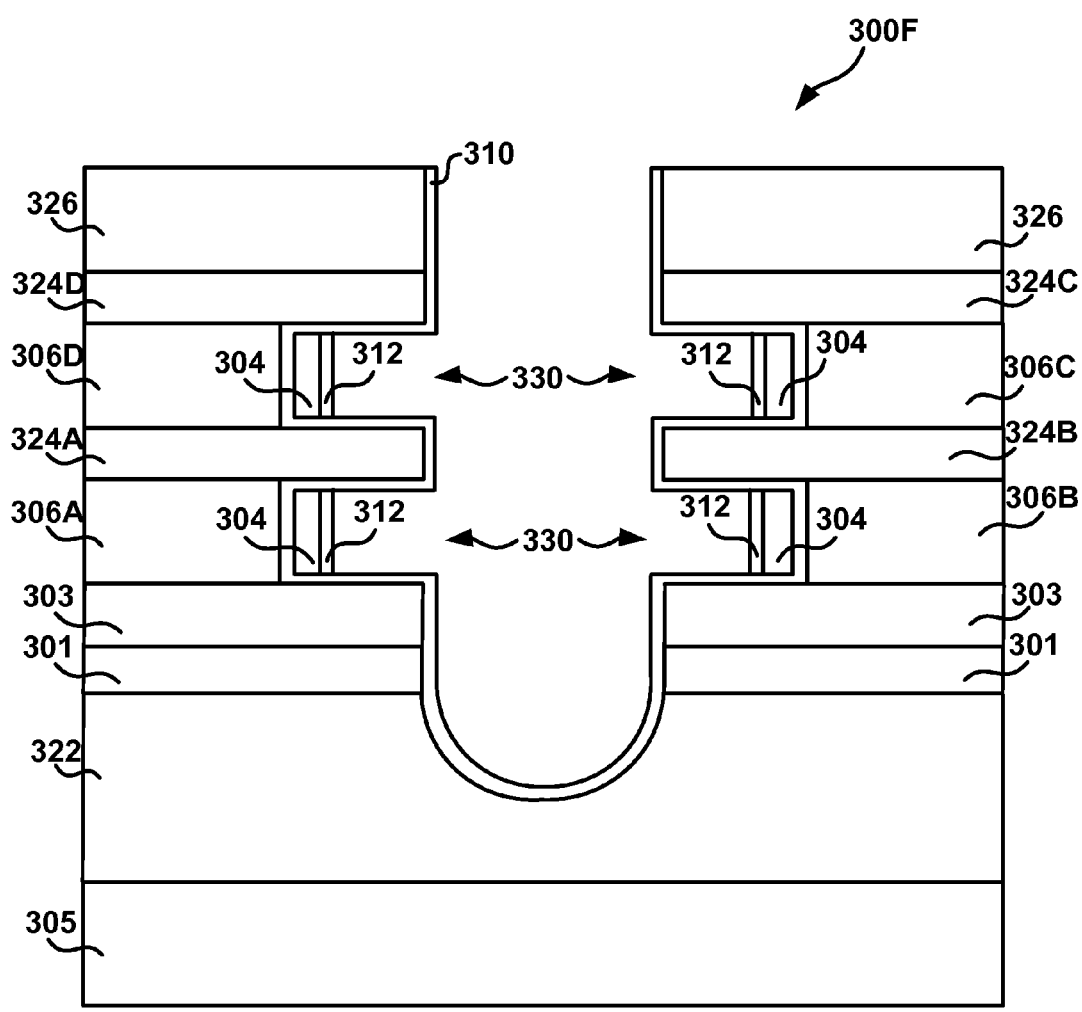

A dielectric 312 (which may or may not be substantially the same dielectric material as the oxidized polysilicon 310 or the polysilicon 308, as shown in FIG. 3C and 3B, respectively) may be formed, such as by growing the dielectric 312 using an ISSG process, on the nitride structures 304, such as shown in the device 300F of FIG. 3F.

Figure 3G:
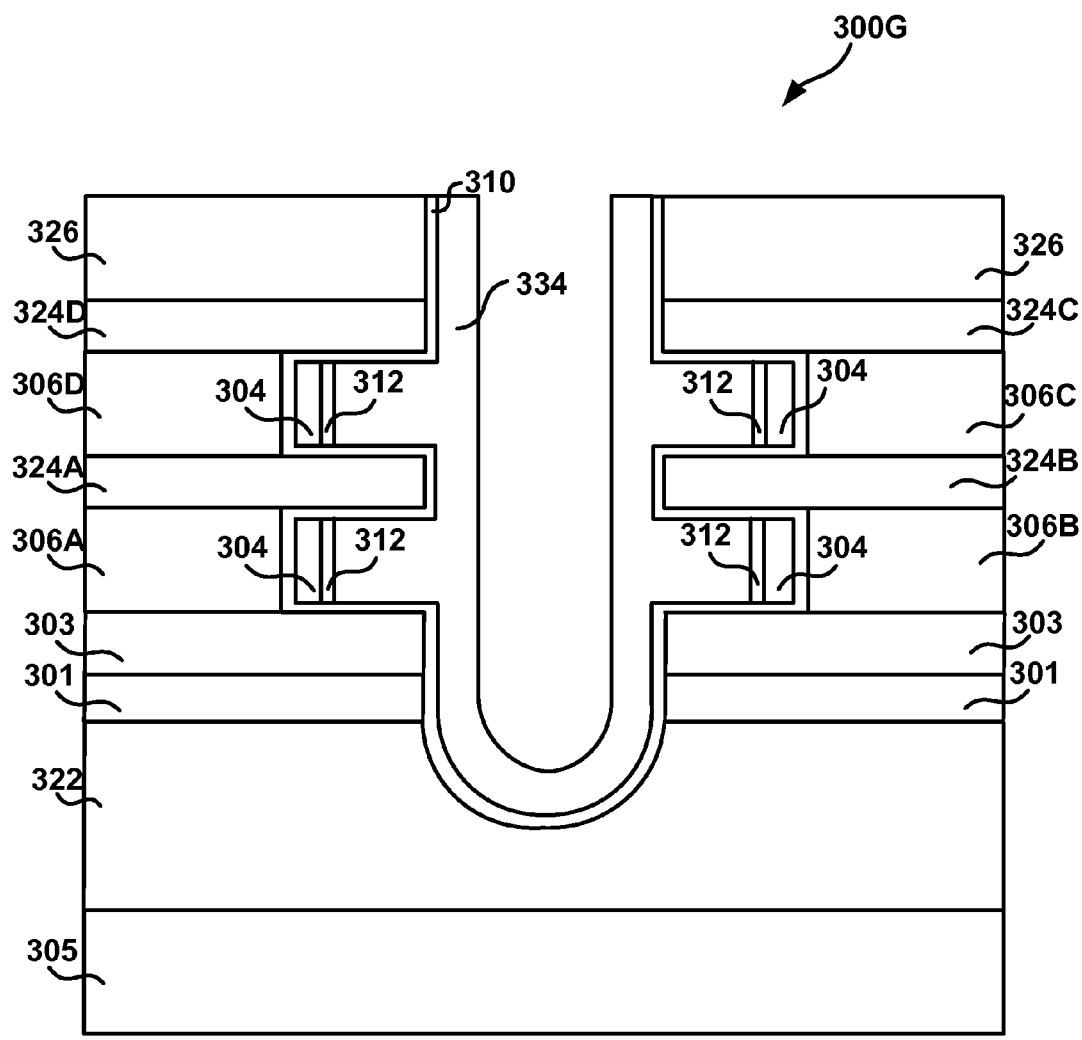
Figure 3H:
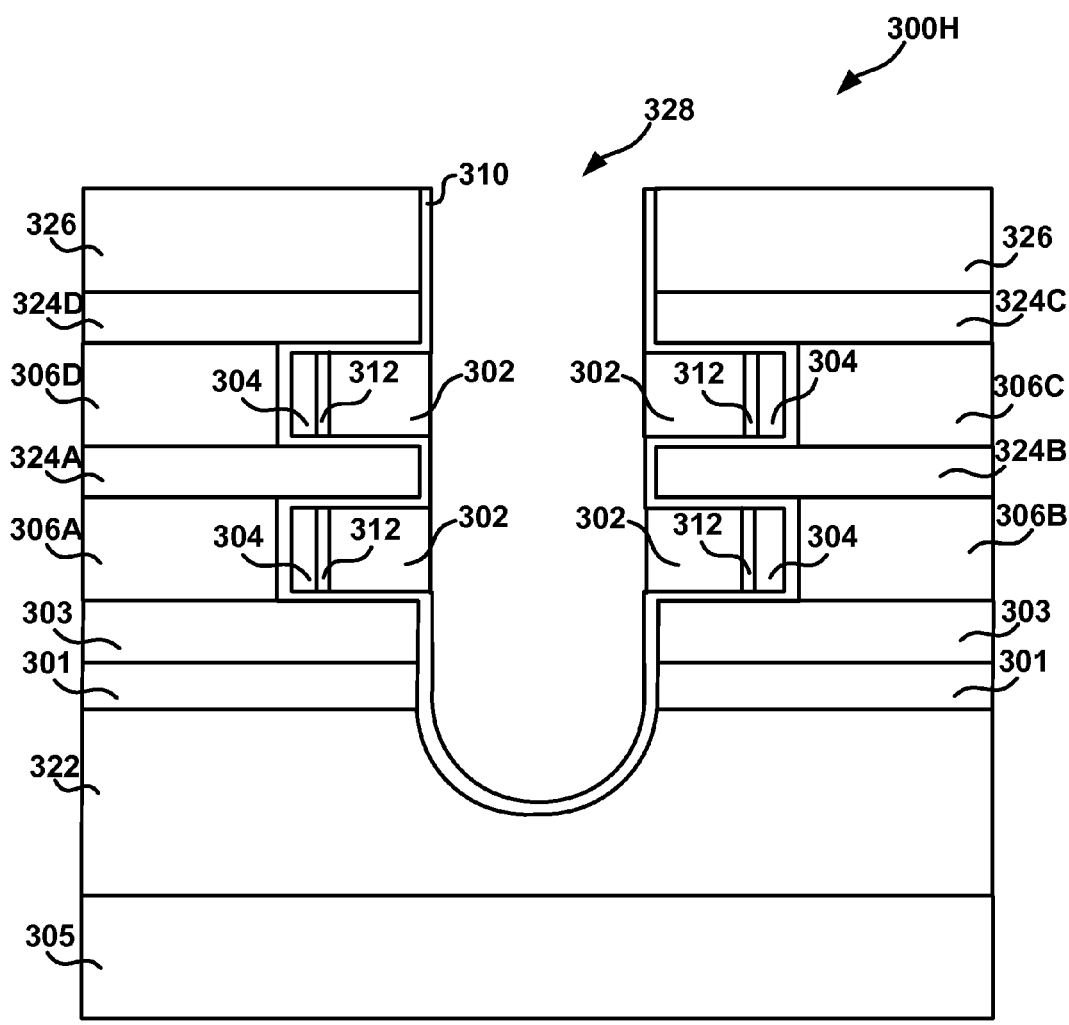

The trench 328 and the CG recesses 330 may be at least partially filled with a charge storage material 334, such as shown in device 300G of FIG. 3G. The charge storage material 334 may be conductively doped polysilicon. The charge storage material 334 may be deposited to at least partially fill the CG recesses 330. The charge storage material 334 may be at least partially removed to form the FGs 302, such as shown in the device 300H of FIG. 3H. The charge storage material 334 may be at least partially removed from the trench 328 and CG recesses 330, and remaining portions of the charge storage material 334 may be left in the CG recesses 330, such as to form the FGs 302.

The portions of charge storage material 334 may be removed using a Certas™ (e.g., a vapor ammonia), an ammonium fluoride and nitric acid mix (NH4F—HNO3), an ozone (O3) or hydrofluoric acid (HF) mix or cycle (e.g., exposed surfaces may be exposed to ozone to create oxide (e.g., oxidize) the surface and the oxidized surface may be exposed to hydrofluoric acid to remove the oxide), hydrofluoric acid and nitric acid mix (HF-HNO3), hydrofluoric acid and hydrogen peroxide mix (HF—H2O2), or a tetra methyl ammonium hydroxide (TMAH) process. The process used to remove portions of charge storage material 334 may be a function of the doping of the charge storage material 334. For example, if the charge storage material 334 is n-type polysilicon, the TMAH process may be used to remove the portions of charge storage material 334.

Figure 3I:
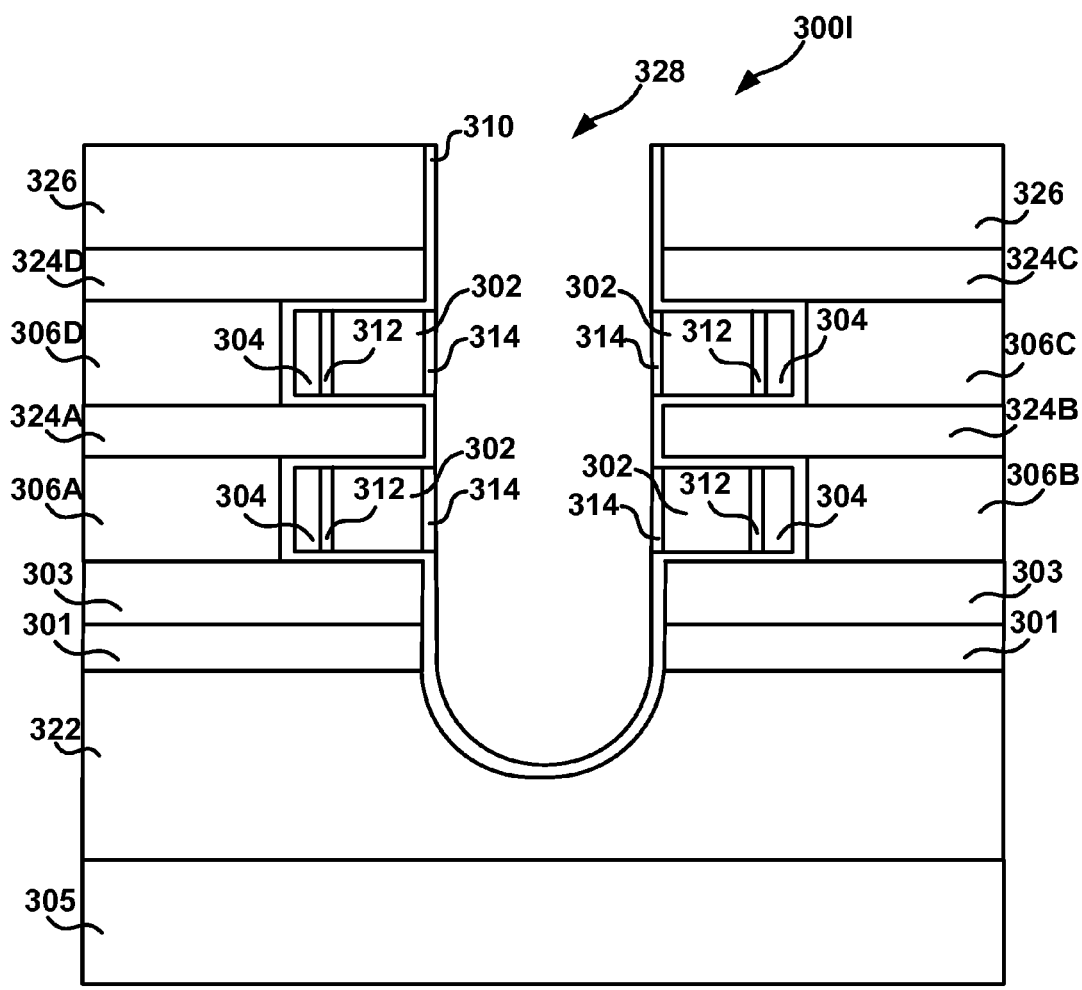
Figure 3J:
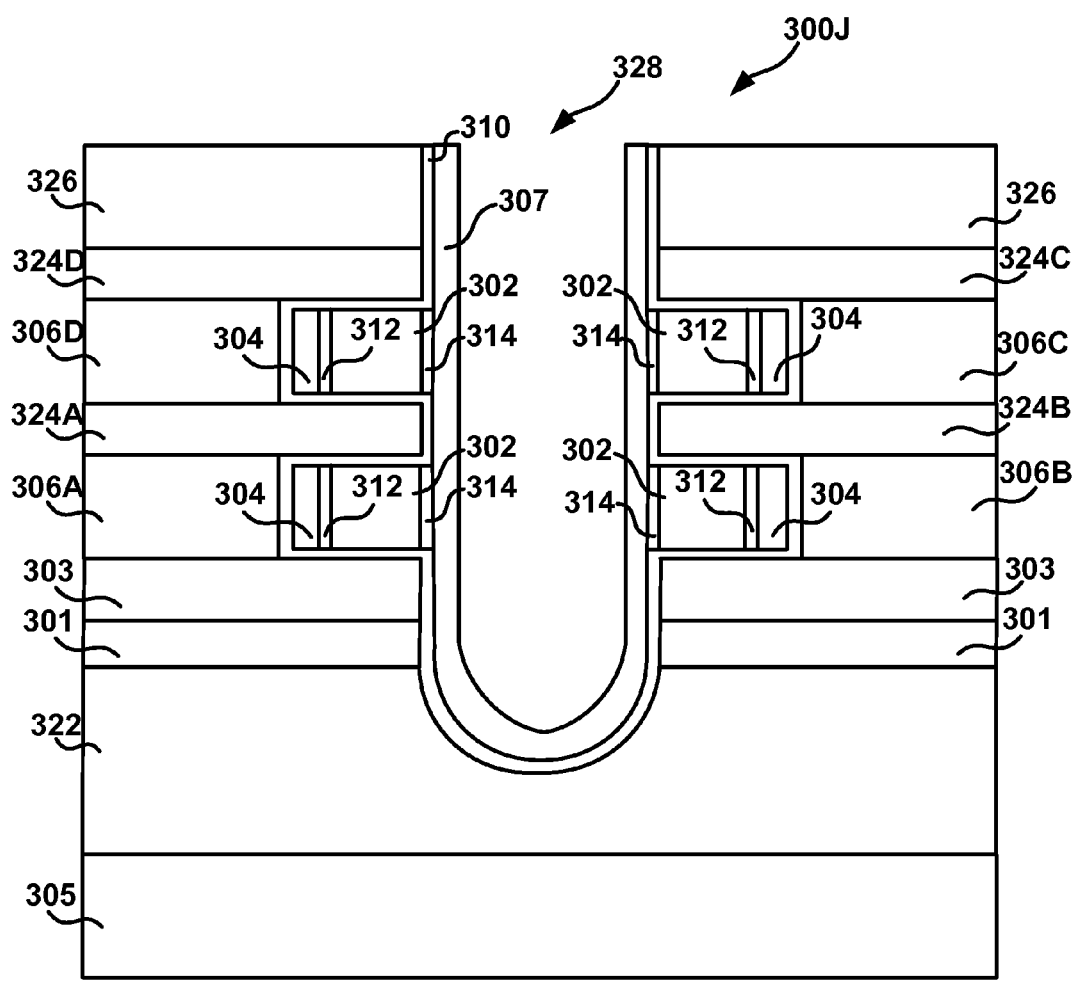

A dielectric 314, such as a tunnel oxide, may be formed (e.g., grown using an ISSG process) on the FGs 302, such as shown on device 300I of FIG. 3I. One or more polysilicon liners 307 may be deposited, so as to conform to an outline of and at least partially fill the trench 328. A device 300J including the polysilicon liner(s) 307 is shown in FIG. 3J. The polysilicon liner 307 can be formed on exposed surfaces of the trench 328, such as the sidewalls of the trench 328.

Figure 3K:
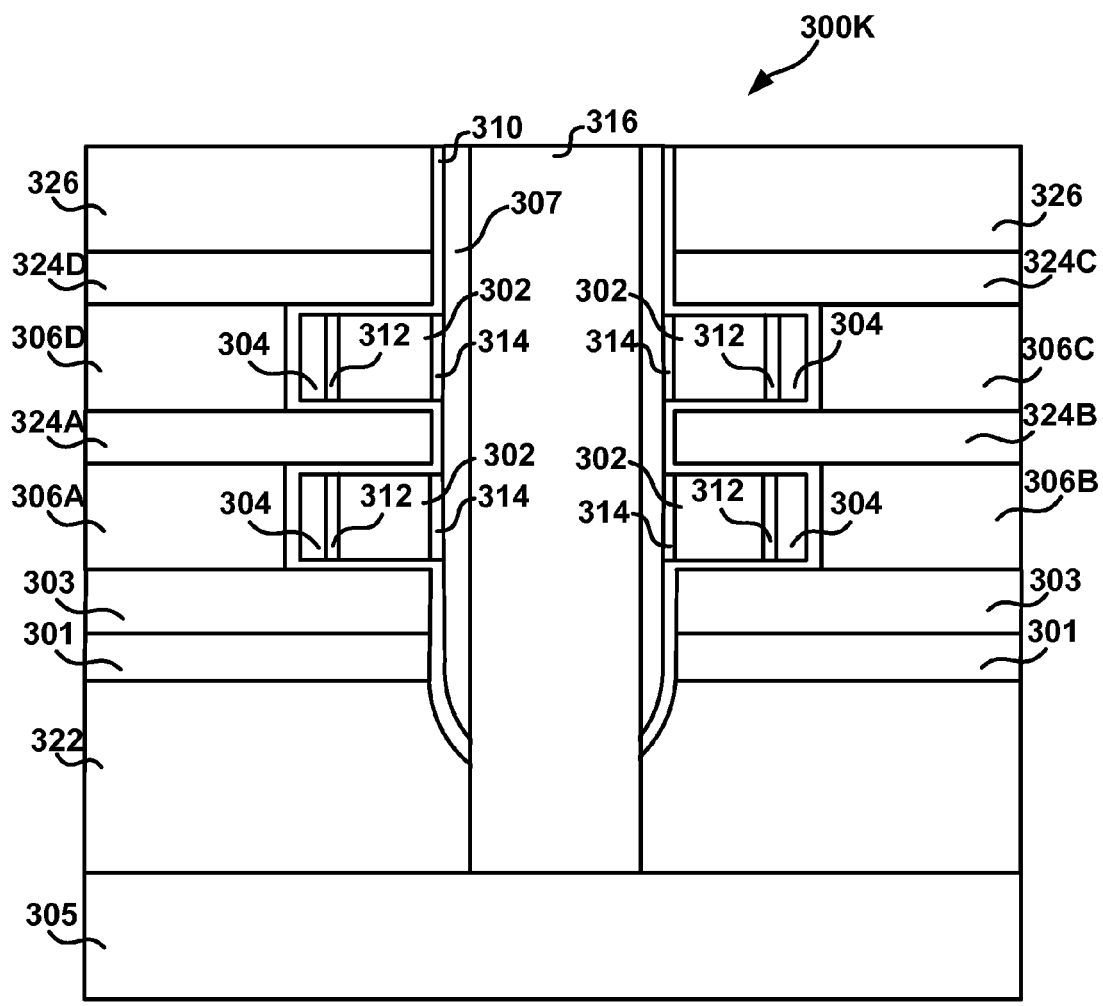

The liner 307 may protect or shield the oxidized polysilicon 310 and/or the dielectric 314 from a downstream process. The device 300K of FIG. 3K shows the device 300J after a punch (e.g., a dry etch) through the bottom of the trench 328 and to the source 305 (e.g., a polysilicon material) has been formed and at least partially filled with a channel material 316. The polysilicon liner 307 and/or oxidized polysilicon 310 in the bottom of the trench 328, and a portion of the etch stop material 322 may be punched through or otherwise removed, such as to allow electrical contact to the source 305 (e.g., through the channel material 316).

The CG 306, polysilicon 308, dielectric 312, charge storage material 334, and/or nitride material 332 may be deposited (e.g., conformally deposited) using a Plasma Enhanced Chemical Vapor Deposition (PECVD) process.

FIGS. 4A-4E show an example of a technique of making a device 400. Note that the notation "400" is used herein to refer generally to the result of a process that may include intermediate devices 400A, 400B, 400C, 400D, and/or 400E. The technique as shown in FIGS. 4A-4E includes an at least partially oxidized polysilicon protecting an etch stop material (e.g., a metal oxide) from a downstream process (e.g., a hot phosphoric acid removal process or another process mentioned with regard to FIGS. 4B-4E).

Figure 4A:
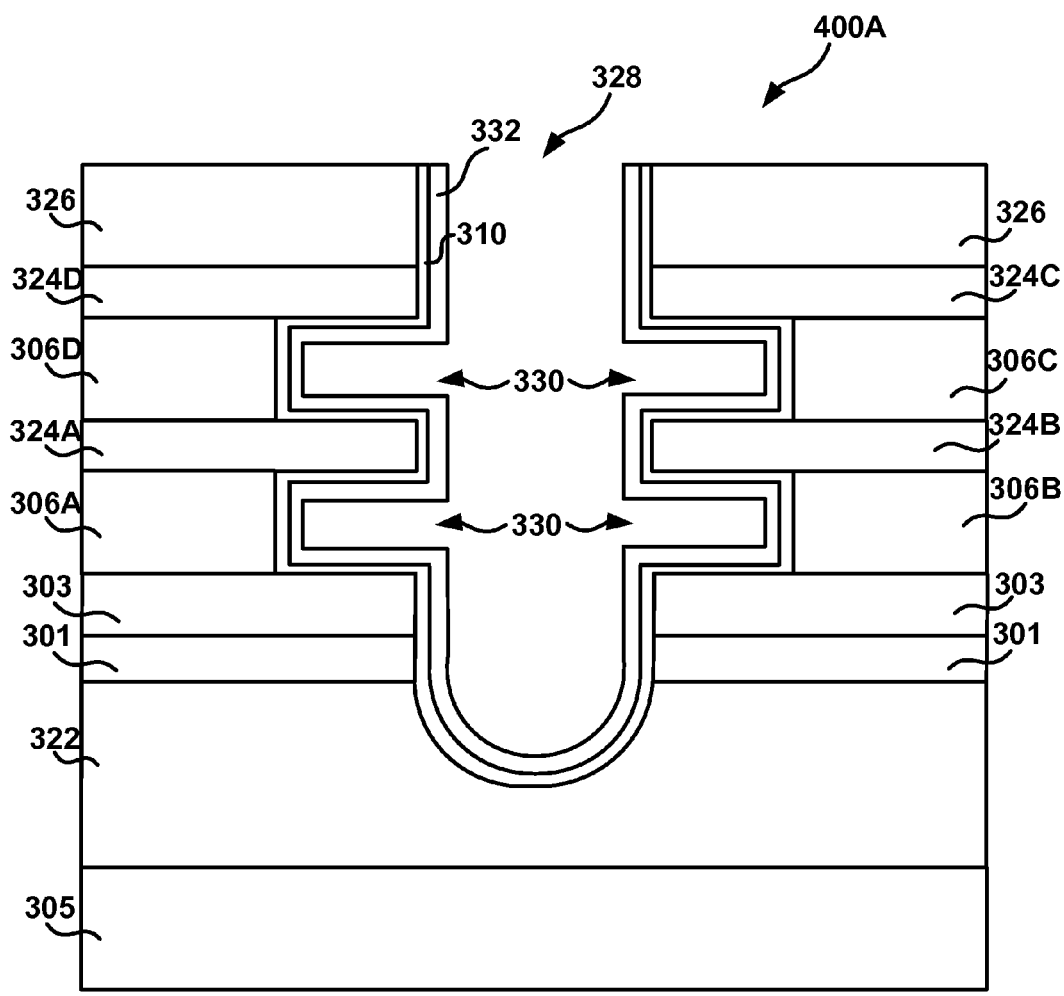
FIGS. 4A-4E illustrate, by way of example, block diagram of another embodiment of a technique of making a vertical memory.
Figure 4B:
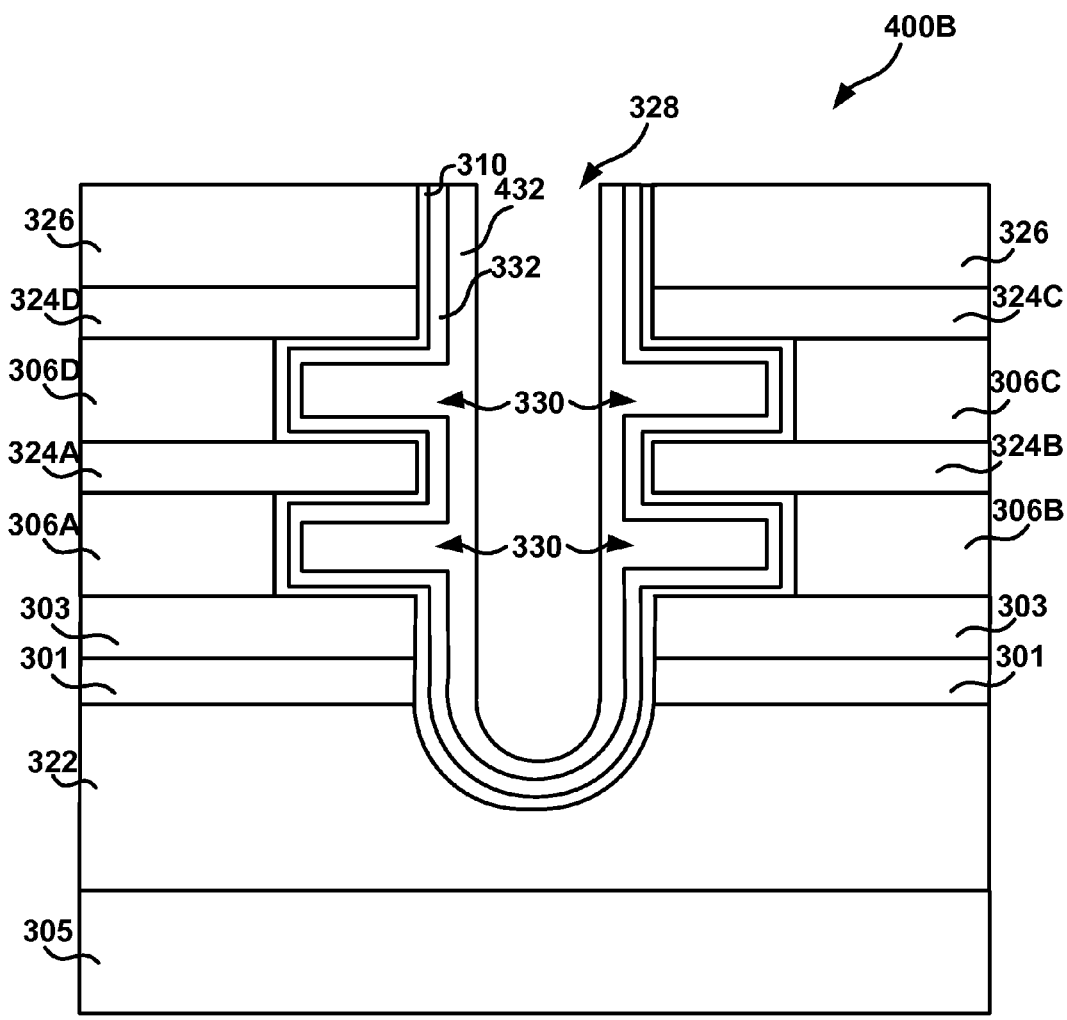
Figure 4C:
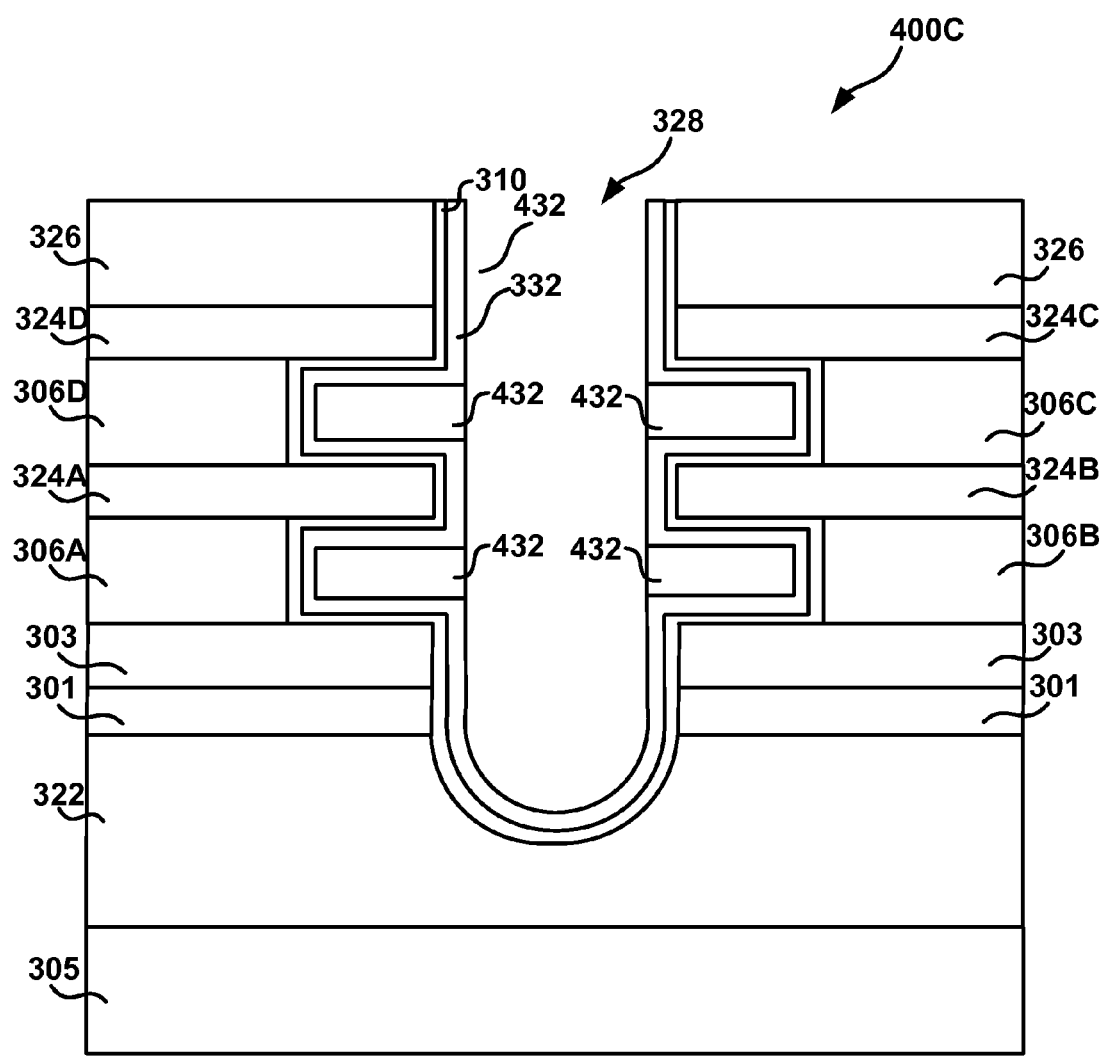

The device 400A in FIG. 4A may be substantially similar to the device 300C shown in FIG. 3C with a nitride material 332 deposited (e.g., conformally deposited) on the oxidized polysilicon 310. A sacrificial material 432 may be deposited in the trench 328, such as shown in device 400B of FIG. 4B. The sacrificial material 432 may be deposited or otherwise formed on the nitride material 332 in the trench 328 and CG recesses 330. The sacrificial material 432 may be deposited using an Atomic Layer Deposition (ALD) process, High Aspect Ratio Process (HARP), or other process. The sacrificial material 432 may be a polysilicon, oxide, Tetraethyl Ortho silicate (TEOS), an organic, such as carbon Bottom Anti-Reflective Coating (BARC) or resist, nitride, doped versions thereof, or combinations thereof. The sacrificial material 432 may be useful in techniques where a downstream process, such as phosphoric acid nitride material removal, may damage the material that would otherwise become an FG 302 if the sacrificial material 432 were not used. The sacrificial material 432 may be at least partially removed from the trench 328, leaving some sacrificial material 432 in the CG recesses 330, such as shown in the device 400C of FIG. 4C. In embodiments in which the sacrificial material 432 comprises polysilicon a TMAH, ammonia (NH4OH), or vapor ammonia process may be used to at least partially remove the sacrificial material 432. When the sacrificial material 432 comprises an oxide or nitride deposited by means of an ALD or other process, hydrofluoric acid or hot phosphoric acid may be used to at least partially remove the sacrificial material 432. When the sacrificial material 432 comprises TEOS or a HARP material hydrofluoric acid may be used to at least partially remove the sacrificial material 432. When the sacrificial material comprises BARC or resist an anisotropic dry etch or plasma dry strip (e.g., "descum") may be used to at least partially remove the sacrificial material 432.

Figure 4D:
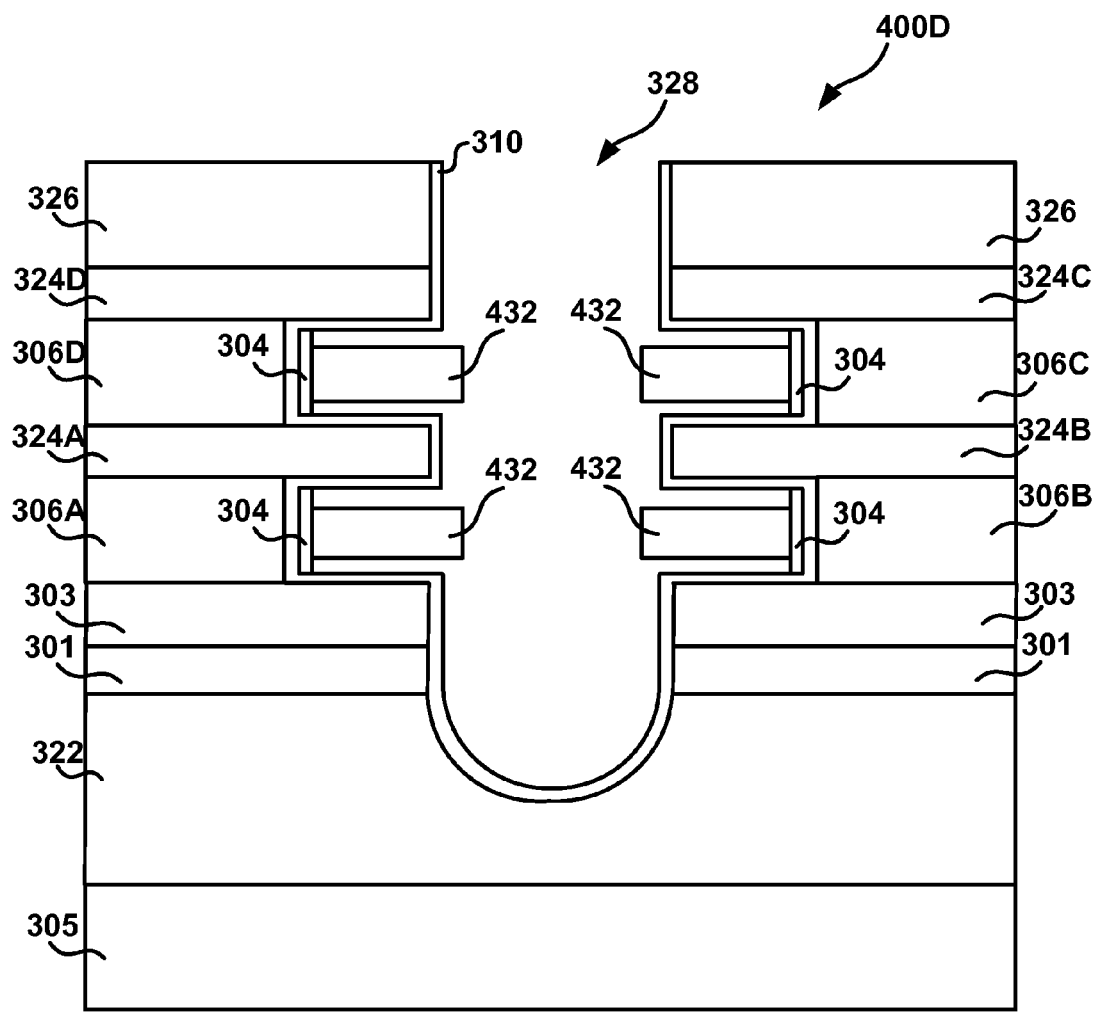
Figure 4E:
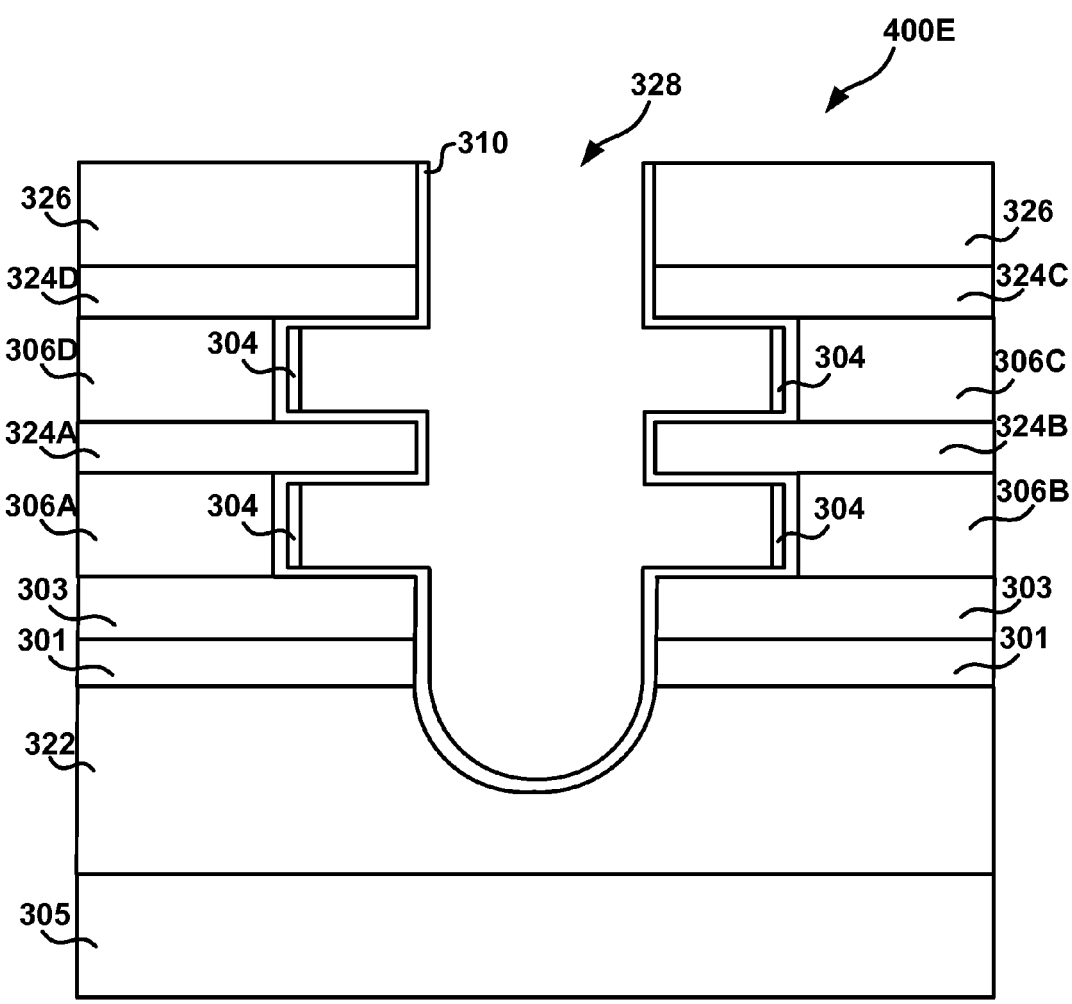

As shown in device 400D of FIG. 4D, portions of the nitride material 332 may be removed, such as by using hydrofluoric acid, from the sidewalls of the trench 328 and portions of exposed surfaces of the CG recesses 330. The nitride material 332 may be etched to at least partially remove the nitride material 332 from the trench 328 and the CG recesses 330. As shown in the device 400D of FIG. 4D, the etching may form a nitride structure 304 adjacent to the oxidized polysilicon 310 in a respective CG recess 330. The sacrificial material 432 may be resistant to a removal process such as to be protected from the removal process used to remove the nitride material 332. The removal process may include a chemical etch that includes a chemical, such as hot phosphoric acid, that selectively removes portions of the nitride material 332 and does not remove or interact with the oxidized polysilicon 310. The oxidized polysilicon 310 may help protect the etch stop material 322 from being damaged or otherwise altered by the etching or removal of the nitride material 332. The sacrificial material 432 may be removed, such as shown in device 400E FIG. 4E. The device 400E of FIG. 4E is substantially similar to the device 300E of FIG. 3E, with the device 400E formed by a different process than the device 300E. The device 400E can be processed in the same manner as the device 300E, such as to produce the device 300K of FIG. 3K (by following the steps depicted and described with regard to FIG. 3F-3K).

One or more embodiments discussed herein may provide an alternative to using an expensive chemical process or using a hafnium oxide (HfOx) material. Using an oxidized polysilicon may help provide a physical barrier to protect an etch stop material (e.g., a metal oxide) from a downstream process. One or more embodiments discussed herein may provide a generally planar nitride structure 304, as compared to a nitride structure that surrounds an FG on three sides.

A problem associated with memory cells that include a nitride adjacent to an FG on more than one side may be charges getting trapped in portions of the nitride that do not separate the FG and a CG (e.g., in portions of the nitride that are not directly between the FG and the CG). Also, trapped charge may migrate along the IGD, such as through program, erase, or temperature cycling. Such charge trapping or movement may alter the threshold voltage ($V_t$) of the memory cell or degrade incremental step pulse programming (ISPP) relative to memory cells that do not have such charge trapping in the nitride.

Such charge trapping or migration on the nitride may be at least partially eliminated by including nitride adjacent to only one surface of the FG (e.g., by including nitride that is substantially rectangular and not "U" shaped). Such a configuration may include charge being trapped on the FG rather than on the nitride.

An advantage of one or more embodiments may include reducing the incidents of erase saturation in memory cells. Another advantage may include improved alignment between the FG and CG due to eliminating a source of variation in manufacturing, such as the nitride wrapping in irregular shapes around corners in a CG recess or a tier oxide. Instead the FG shape and size may be defined by a plasma enhanced chemical vapor deposition (PECVD) process, which may be a substantially uniform stack deposition process.

Program and erase properties of a memory cell are a function of a gate coupling ratio, which is a function of a capacitance between the FG and the CG of a memory cell. With a device 300 or 400 that includes a planar nitride structure 304, such as shown in the FIGS. 3E-3K and 4E, the capacitance created between the IGD and the FG may be reduced or eliminated, such as to make the capacitance a function of the distance between a surface of the FG 302 and an opposing surface of the CG 306. Such a configuration may reduce the sources of variation in the gate coupling ratio, such as to improve the uniformity in memory cell program and erase performance. A device with improved FG to CG alignment may include an improved $V_g$ or $V_t$, such as to help better control a channel formation. Another advantage may include reducing ISPP degradation issues or maintaining a sufficiently low $V_t$, such as by reducing the $V_t$ shift caused by cycling by reducing the charge trapped on the nitride.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. A device comprising:
   a first polysilicon material;
   an etch stop material on the first polysilicon material;
   a second polysilicon material on the etch stop material;
   a first tier dielectric material on the second polysilicon material;
   a first control gate over the etch stop material and on the first tier dielectric material;
   a first control gate recess adjacent the first control gate;
   a trench adjacent the first control gate recess;
   an at least partially oxidized polysilicon on at least a portion of the etch stop material,
   wherein the at least partially oxidized polysilicon lines a sidewall of the trench and lines the first control gate recess, the at least partially oxidized polysilicon in contact with the control gate;
   a nitride in contact with the at least partially oxidized polysilicon and in the first control gate recess, the at least partially oxidized polysilicon between the nitride and the first control gate;
   a dielectric in contact with the at least partially oxidized polysilicon and in the first control gate recess, the nitride between the dielectric and the at least partially oxidized polysilicon;
   a floating gate in contact with the at least partially oxidized polysilicon and in the first control gate recess, the dielectric between the floating gate and the nitride; and
   a tunnel oxide adjacent the floating gate.

2. The device of claim 1, wherein the at least partially oxidized polysilicon includes a polysilicon at least partially oxidized using an in situ steam generation (ISSG) process.

3. The device of claim 1, wherein the trench includes substantially vertical sidewalls.

4. The device of claim 1, wherein the etch stop material includes aluminum oxide.

5. The device of claim 1, further comprising:
   a second tier dielectric on the first CG;
   a second CG on the second tier dielectric;
   a second CG recess adjacent the second CG; and
   a third tier dielectric on the second CG;
   wherein the trench is further adjacent to the third tier dielectric, second tier dielectric, second CG recess, and first tier dielectric; and
   wherein the at least partially oxidized polysilicon further lines the second CG recess.

6. The device of claim 5, wherein the device further comprises:
   a second nitride material adjacent the oxidized polysilicon in the second CG recess, wherein the first and second nitride materials are electrically isolated from each other.

* * * * *